(12) United States Patent
Yokoyama et al.

(10) Patent No.: US 6,878,960 B2
(45) Date of Patent: Apr. 12, 2005

(54) MULTIPLICATION DEVICE COMPRISING RESIN-DISPERSED ORGANIC SEMICONDUCTOR FILM AND METHOD FOR PRODUCING THE SAME

(75) Inventors: Masaaki Yokoyama, Nishinomiya (JP); Ken-ichi Nakayama, Suita (JP); Masahiro Hiramoto, Takatsuki (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 10/362,909

(22) PCT Filed: Mar. 23, 2001

(86) PCT No.: PCT/JP01/02378

§ 371 (c)(1),
(2), (4) Date: Feb. 27, 2003

(87) PCT Pub. No.: WO02/21603

PCT Pub. Date: Mar. 14, 2002

(65) Prior Publication Data

US 2003/0180998 A1 Sep. 25, 2003

(30) Foreign Application Priority Data

Sep. 1, 2000  (JP) ........................................ 2000-265224

(51) Int. Cl.$^7$ ........................... H01L 31/09; H05B 33/12
(52) U.S. Cl. ............................ 257/40; 257/59; 257/290; 257/432
(58) Field of Search ........................... 257/21, 40, 59, 257/72, 79, 85, 98, 103, 183–186, 200, 222, 225, 290, 414, 432; 250/208.1, 214.1, 226, 370.11, 372; 313/504, 506

(56) References Cited

U.S. PATENT DOCUMENTS 4,085,321 A  4/1978 Sliva 5,142,343 A  * 8/1992 Hosokawa et al. ......... 257/103
5,656,407 A  * 8/1997 Kawahara ..................... 430/78
6,137,118 A  * 10/2000 Kunugi et al. ................ 257/40

FOREIGN PATENT DOCUMENTS

| JP | 63-92065 | 4/1988 |
| JP | 1-98266 | 4/1989 |
| JP | 6-275864 | 9/1994 |
| JP | 6-326338 | 11/1994 |
| JP | 11-329736 | 11/1999 |

OTHER PUBLICATIONS

Hiramoto, Masahiro; Imahigashi, Takashi; Yokoyama, Masaaki, "Photocurrent multiplication in organic pigment films," Applied Physics Letters, Jan. 10, 1994, vol. 64 Issue 2, p187.*

Masahiro Hiramoto et al., "Light Amplification in a New Light Transducer Combining an Organic Electroluminescent Diode with Photoresponsive Organic Pigment Film"; Optical Review, vol. 1, No. 1 (1994); pp 82–84.

Taldashi Katsume et al.; Applied Physics Letters, vol. 64, No. 2, pp. 2546–2548, Jan. 10, 1994. Cited in the int'l. search report.

Masahiro Hiramoto et al.; Applied Physics Letters, vol. 64, No. 19, pp. 187–189, May 9, 1994. Cited in the int'l. search report.

* cited by examiner

Primary Examiner—Minhloan Tran
Assistant Examiner—Thomas L Dickey

(57) ABSTRACT

A resin-dispersed organic semiconductor layer (3) is formed on a lower electrode (2) of an ITO transparent electrode formed on a glass substrate (1). An upper electrode (4) of a gold deposited film is formed on the resin-dispersed organic semiconductor layer (3). The resin-dispersed organic semiconductor layer (3) is formed by spin-coating a dispersion liquid prepared by mixing a perylene pigment and polycarbonate in a THF solvent and drying the coating. By applying a voltage by means of the electrodes (2, 4) and by irradiating the resin-dispersed organic semiconductor layer (3) with light, a multiplied light irradiation-induced current flows.

6 Claims, 6 Drawing Sheets

C6

C7

C8

C9

C10

C11

C12

C13

C14

C15

C20

C21

MULTIPLICATION DEVICE COMPRISING RESIN-DISPERSED ORGANIC SEMICONDUCTOR FILM AND METHOD FOR PRODUCING THE SAME

BACKGROUND OF THE INVENTION

1. Field of the Invention

The present invention relates to organic optoelectronic devices, and more particularly, relates to a photocurrent multiplication device comprising a photocurrent multiplication phenomenon brought about by a photoconductive organic semiconductor and a light-light conversion device additionally including an organic electroluminescent layer for obtaining light-light converted light, and relates to methods for producing such devices.

2. Background Art

In the past, a photocurrent multiplication phenomenon exhibiting a photocurrent quantum yield exceeding ten thousand has been reported to occur in a device including a vacuum-evaporated film made of an organic pigment as a photocurrent multiplication layer and two metal electrodes sandwiching the photocurrent multiplication layer (see M. Hiramoto, T. Imahigashi and M. Yokoyama, Appl. Phys. Lett., 64, 187 (1994)).

However, such a photocurrent multiplication phenomenon occurring in an organic material has been observed only in a device using an organic thin film formed by vacuum evaporation as a photocurrent multiplication layer.

Also a light-light conversion device has been reported, in which an organic electroluminescent (organic EL) film is formed integrally on a photocurrent multiplication layer made of an organic pigment for performing light wavelength conversion and light amplification (see T. Katsume, M. Hiramoto and M. Yokoyama, Appl. Phys. Lett., 64, 2546 (1994), and M. Hiramoto, T. Katsume and M. Yokoyama, Opt. Rev., 1, 82 (1994)). In this case, also, the photocurrent multiplication layer is made of a vacuum-evaporated film of an organic pigment.

The conventional organic thin film formed by vacuum evaporation as the photocurrent multiplication layer has the following problem. Pinholes tend to be generated due to non-uniformity of the film, and this increases the probability of occurrence of conduction between the upper and lower electrodes. For this reason, it is difficult to increase the area.

Moreover, the vacuum evaporation method employed for formation of the photocurrent multiplication layer requires use of a large-scale apparatus for vacuuming.

The first object of the present invention is to provide a multiplication device, such as a photocurrent multiplication device and a light-light conversion device, in which conduction between upper and lower electrodes occurs less easily and thus increase of the area is possible.

The second object of the present invention is to provide a method for producing such a multiplication device easily.

SUMMARY OF THE INVENTION

The multiplication device of the present invention includes a photocurrent multiplication device and a light-light conversion device. As schematically illustrated in FIG. 1, the photocurrent multiplication device comprises: a resin-dispersed organic semiconductor layer 3 in which a photoconductive organic semiconductor is dispersed in a resin; and electrodes 4 and 2 formed on the front and back surfaces of the resin-dispersed organic semiconductor layer 3. The reference numeral 1 denotes a glass substrate, which may be provided on the side of either of the electrodes 2 and 4. Assume herein that the glass substrate 1 is provided to support the electrode 2. The resin-dispersed organic semiconductor layer 3 is irradiated with light 18 while a voltage is applied to the resin-dispersed organic semiconductor layer 3 from a power supply 7 by means of the electrodes 2 and 4, to obtain light-irradiation induced current at a multiplied quantum yield.

The light 18 may be irradiated from either of the electrodes 2 and 4. At least the electrode irradiated with light must be transparent to the light As schematically illustrated in FIG. 2, the light-light conversion device of the present invention comprises a layered structure 12 composed of a resin-dispersed organic semiconductor layer 3 in which a photoconductive organic semiconductor is dispersed in a resin; and an organic electroluminescent layer 10 integrally formed on the resin-dispersed organic semiconductor layer 3. Electrodes 2 and 4 are respectively formed on the resin-dispersed organic semiconductor layer 3 and the organic electroluminescent layer 10 of the layered structure 12. A hole transport layer 11 is preferably interposed between the organic electroluminescent layer 10 and the electrode 4 as illustrated. In this light-light conversion device, also, a glass substrate 1 may be provided on the side of either of the electrodes 2 and 4. Assume herein that the glass substrate 1 is provided to support the electrode 2. The resin-dispersed organic semiconductor layer 3 is irradiated with light 18 while a voltage is applied to the layered structure 12 from a power supply 7 by means of the electrodes 2 and 4 and the hole transport layer 11, to obtain light-light converted light 20 output from the organic electroluminescent layer 10. The reference numeral 18' denotes transmitted light, part of the incident light 18 transmitted by the device.

In the light-light conversion device, since the resin-dispersed organic semiconductor layer 3 is irradiated with the light 18 through the electrode 2, the electrode 2 must be transparent to the illumination light. Also, since the light-light converted light 20 is output from the organic electroluminescent layer 10 through the hole transport layer 11 and the electrode 4, the hole transport layer 11 and the electrode 4 must be transparent to the light 20.

The photoconductive organic semiconductor is an organic compound exhibiting insulation as long as it is not irradiated with light but becoming conductive upon receipt of light irradiation.

In general, a dispersion resin layer is high in film uniformity compared with a vacuum-evaporated film. Therefore, the probability of conduction between upper and lower electrodes is low, and the mechanical strength is high. For this reason, the photocurrent multiplication device and the light-light conversion device comprising the resin-dispersed organic semiconductor layer of the present invention have a feature that production of a large-area device is possible.

In the method for producing the photocurrent multiplication device and the light-light conversion device according to the present invention, the step of forming a resin-dispersed organic semiconductor layer is to apply a liquid of a photoconductive organic semiconductor and a resin mixed in a solvent to an electrode substrate by spin coating or bar coating (a method for forming a large-area uniform film by thinly stretching a dispersion liquid applied to a substrate with a grooved metal bar).

By adopting the above step, an organic semiconductor layer can be easily formed without the necessity of a vacuuming process.

In the vacuum evaporation, mixing of a plurality of materials is very difficult because precise control of the evaporation rate is necessary. In the photocurrent multiplication device and the light-light conversion device of the present invention comprising the resin-dispersed organic semiconductor layer, the dispersion ratio of a plurality of materials can be set arbitrarily. Therefore, the performance of the device can be easily controlled.

As the photoconductive organic semiconductor to be dispersed in a resin to obtain the resin-dispersed organic semiconductor layer, π-electron organic compounds are preferred, main ones of which are organic pigments. Examples of the photoconductive organic semiconductors suitably usable according to the present invention include: perylene pigments such as 3,4,9,10-perylenetetracarboxylic 3,4:9,10-bis(methylimide) (shown by code C6 in FIG. 3), 3,4,9,10-perylenetetracarboxylic 3,4:9,10-bis (phenylethylimide), 3,4,9,10-perylenetetracarboxylic dianhydride and imidazole-perylene (Im-perylene) (shown by code C15 in FIG. 3); phthalocyanine pigments such as copper phthalocyanine (shown by code C7 in FIG. 3), titanylphthalocyanine, vanadylphthalocyanine, magnesium phthalocyanine, non-metal phthalocyanine and naphthalocyanine; naphthalene and naphthalene derivatives such as 1,4,5,8-naphthalenetetracarboxylic dianhydride (shown by code C8 in FIG. 3) and 1,4,5,8-naphthalenetetracarboxylic-bis(methylimide); quinacridon pigments such as 2,9-dimethylquinacridon (shown by C9 in FIG. 3) and non-substituted quinacridon; and photoconductive organic semiconductor molecules such as pentacene (shown by C10 in FIG. 3), 6,13-pentacenequinone and 5,7,12,14-pentacenetetrone and derivatives thereof. These pigments may be used singly or as a mixture of two or more kinds.

Examples of the resin for dispersion include: general polymers such as polycarbonate (shown by code C11 in FIG. 3), polyvinyl butyral (shown by C12 in FIG. 3), polyvinyl alcohol, polystyrene and polymethacrylic acid methyl; and conductive polymers such as polyvinyl carbazole (shown by C13 in FIG. 3), polymethyl phenylsilane (shown by C14 in FIG. 3) and polydimethyl silane.

Examples of the organic electroluminescent layer constituting the light-light conversion device include evaporated films of an aluminum-quinolinol complex (Alq3) (shown by C20 in FIG. 4) and 3,4,9,10-perylenetetracarboxylic 3,4:9, 10-bis(phenylethylimide).

Examples of the hole transport layer that may be provided between the organic electroluminescent layer and the electrode of the light-light conversion device include evaporated films of triphenyl-diamine derivatives (TPD) such as N,N-diphenyl-N,N-bis(4-methylphenyl)-4,4-diamine (shown by C21 in FIG. 4), and 3,5-dimethyl-3,5-di(tertiary butyl)-4,4-diphenoquinone, 2-4-biphenyl)-5-(4-tertiary butylphenyl)-1, 3,4-oxadiazole and N,N,N,N-tetra-(m-toluyl)-m-phenylenediamine.

The concentration of the photoconductive organic semiconductor dispersed in the resin to form the resin-dispersed organic semiconductor layer is preferably 30 to 60 wt %. If the concentration is less than 30 wt %, the conductivity of the film decreases, and thus the amount of the irradiation-induced current becomes smaller by this decrease. This deteriorates the photocurrent multiplication property and the light-light conversion property of the multiplication device. On the contrary, if the concentration exceeds 60 wt %, the photocurrent multiplication property and the light-light conversion property improve. However, the uniformity of the film deteriorates, increasing the probability of conduction between the upper and lower electrodes and also deteriorating the mechanical strength. Therefore, production of a large-area device is difficult The thickness of the resin-dispersed organic semiconductor layer is preferably 0.5 to 2.0 μm. If the thickness is smaller than this range, a dark current increases, decreasing the light irradiation-induced current. This deteriorates the photocurrent multiplication property and the light-light conversion property of the multiplication device. This also increases the probability of conduction between the upper and lower electrodes. On the contrary, if the thickness exceeds the above range, a large power supply is required to apply a predetermined voltage to the resin-dispersed organic semiconductor layer. This costs high.

The thickness of the organic electroluminescent layer constituting the light-light conversion device is preferably 0.5 to 1.0 μm.

The thickness of the hole transport layer that may be provided between the organic electroluminescent layer and the electrode of the light-light conversion device is preferably 0.05 to 0.1 μm.

As the electrode film for the upper or lower electrode formed on the side in which optical transparency is required, an ITO (indium tin oxide) transparent electrode, an evaporated or sputtered film of gold or any other metal may be used. The electrode film may be formed on the glass substrate, or may be formed on the resin-dispersed organic semiconductor layer 3 or the layered structure 11 by evaporation or sputtering.

The illumination light 18 may have any wavelength as long as it falls within the range of wavelengths of which light the photoconductive organic semiconductor of the resin-dispersed organic semiconductor layer 3 can absorb.

One desirable property of the light-light conversion device is the light amplification function that the intensity of the output light from the organic electroluminescent layer is greater than the intensity of the input light into the resin-dispersed organic semiconductor layer. Therefore, the structure of the layers and the applied voltage are preferably set so that the light amplification function is attained.

Another desirable property of the light-light conversion device is the wavelength conversion function that the wavelength of the output light from the organic electroluminescent layer is different from the wavelength of the input light into the resin-dispersed organic semiconductor layer. Therefore, as the light-emitting material of the organic electroluminescent layer, one having a light-emitting wavelength falling outside the sensitivity range of the resin-dispersed organic semiconductor layer is preferably used to attain desirable wavelength conversion.

According to the present invention, a photocurrent multiplication device and a light-light conversion device are produced comprising a film made by coating the resin-dispersed organic semiconductor layer. Therefore, a large-area photocurrent multiplication device can be produced easily without use of a vacuuming apparatus.

BRIEF DESCRIPTION OF THE DRAWINGS

FIG. 1 is a graph showing measurement results of the light-light conversion efficiency in the embodiment of the light-light conversion device.

BEST MODE FOR CARRYING OUT THE INVENTION

Hereinafter, embodiments of the present invention shall be described in detail.
(First Embodiment)

Figure 1:
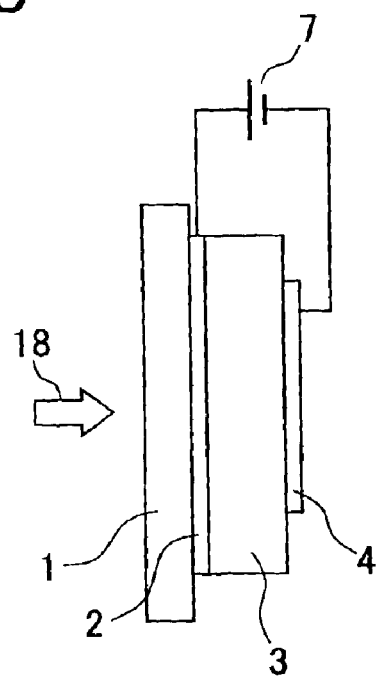
FIG. 1 is a schematic cross-sectional view of a photocurrent multiplication device of the present invention.
Figure 5:
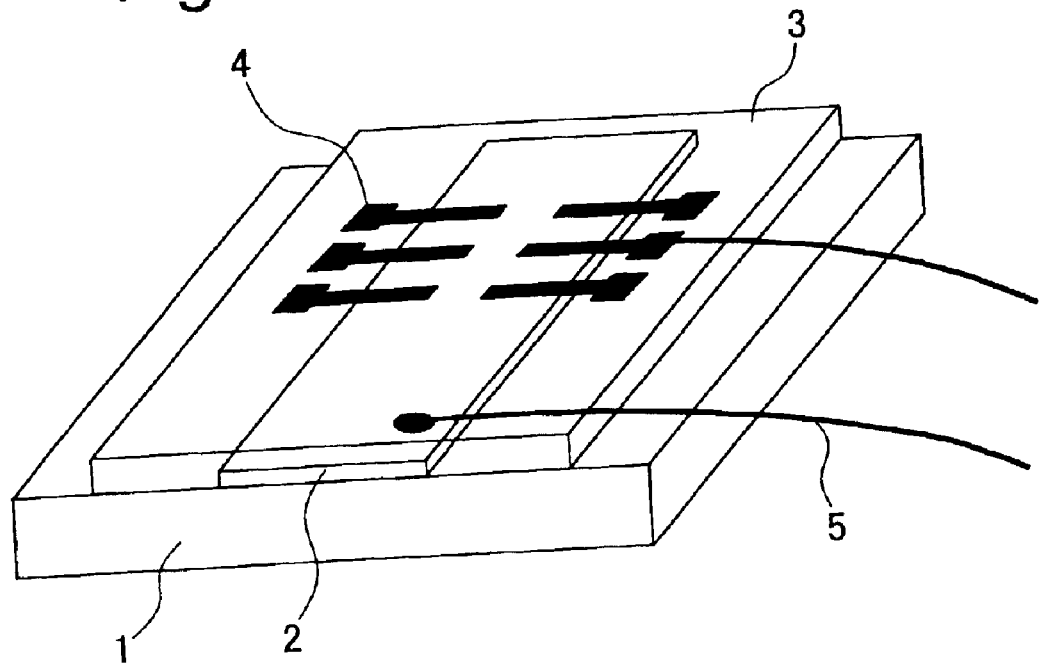
FIG. 5 is a schematic perspective view of a photocurrent multiplication device of an embodiment

FIG. 5 shows an embodiment of the photocurrent multiplication device of the present invention schematically illustrated in FIG. 1 applied as a laboratory model. The electrode 2 serves as the lower electrode formed on the glass substrate 1 for applying a voltage to the resin-dispersed organic semiconductor layer 3. An ITO transparent electrode (thickness: about 0.05 $\mu$m) was used as the lower electrode 2. The resin-dispersed organic semiconductor layer 3 in which a photoconductive organic semiconductor is dispersed in a resin is formed on the glass substrate 1 covering the lower electrode 2. The electrode 4 serves as the upper electrode formed on the resin-dispersed organic semiconductor layer 3, and is made of a gold evaporated film having a thickness of about 0.02 $\mu$m. The upper electrode 4 is composed of a plurality of pieces placed apart from one another so as to enable measurement of the photocurrent at different places because this embodiment is a laboratory model for obtaining measurement data. However, the upper electrode 4 may be basically made of a single body. Leads 5 are attached to the lower and upper electrodes 2 and 4 with silver paste for electrical contact, and the leads 5 are connected to a measurement apparatus.

Figure 3:
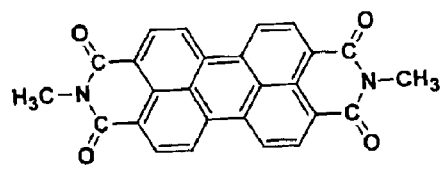
FIG. 3 shows chemical formulae of examples of photoconductive organic semiconductors and resins usable in the present invention.
Figure 3:
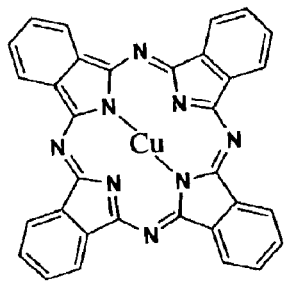
Figure 3:
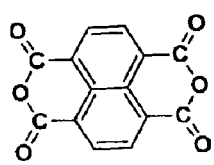
Figure 3:
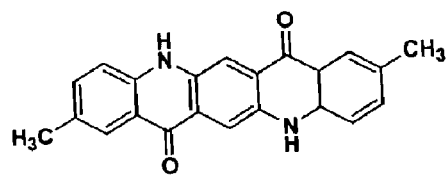
Figure 3:
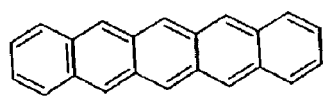
Figure 3:
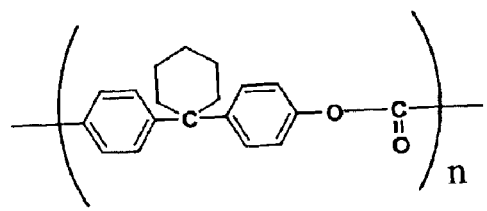
Figure 3:
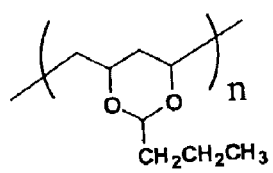
Figure 3:
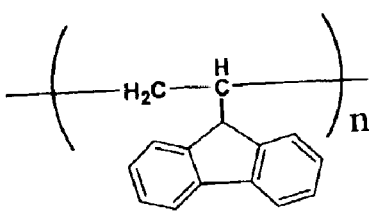
Figure 3:
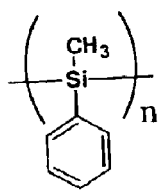
Figure 3:
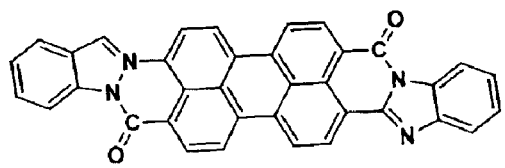

The resin-dispersed organic semiconductor layer 3 was obtained in the following manner. A perylene pigment represented by the chemical formula shown by code C6 in FIG. 3 (3,4,9,10-perylenetetracarboxylic 3,4:9,10-bis(methylimide)) and polycarbonate represented by the chemical formula shown by code C7 in FIG. 3 were mixed in a THF (tetrahydrofuran) solvent, and the mixture was subjected to ball milling with zirconia beads for two days, to obtain a dispersion liquid. The resultant dispersion liquid was applied to the glass substrate with the ITO transparent electrode 2 formed thereon by spin coating (800 revolutions/minute), and then dried. The thickness of the resin-dispersed organic semiconductor layer 3 after drying was about 0.7 $\mu$m. The upper electrode 4 was then formed, and the leads 5 were attached. The lead 5 for the ITO transparent electrode 2 was attached to the ITO electrode with silver paste by removing part of the resin-dispersed organic semiconductor layer 3.

The photocurrent was measured by irradiating the resin-dispersed organic semiconductor layer 3 with light having a wavelength of 600 nm turned to monochromatic light with a monochrometer, through the glass substrate 1, while applying a voltage to the device by means of the electrodes 2 and 4 in a vacuum ($10^{-3}$ Torr).

Figure 6:
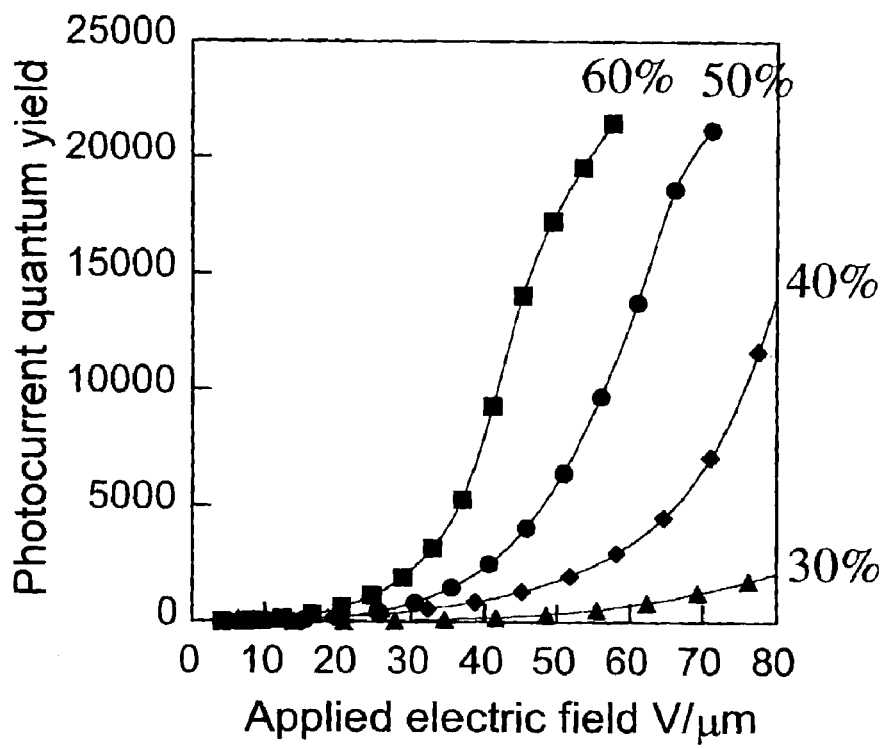
FIG. 6 is a graph showing measurement results of the photocurrent quantum coefficient of photocurrent multiplication devices comprising resin-dispersed organic semiconductor layers having various dispersion concentrations formed by spin coating in the embodiment

FIG. 6 shows the applied electric field dependency of the photocurrent quantum yield for various perylene dispersion concentrations (wt %) of the resin-dispersed organic semiconductor layer 3 in this embodiment. The photocurrent quantum yield was calculated as the ratio of the number of current carriers passing through the device to the number of photons absorbed by the resin-dispersed organic semiconductor layer 3.

The photocurrent quantum yield largely exceeded 100%, or 1, for all the dispersion concentrations, indicating that a photocurrent multiplication phenomenon was observed. For example, for the device having a dispersion concentration of 60%, a quantum yield of about 22000 was observed when the applied electric field was 55 V/$\mu$m. This quantum yield stands comparison with that obtained by the conventional multiplication device using a vacuum-evaporated film as the photocurrent multiplication layer, indicating that there is substantially no deterioration in performance due to the simplified film formation method.

The photocurrent quantum yield is greater as the dispersion concentration of the organic photoconductive organic semiconductor is higher in the same electric field. This indicates that the magnitude of the multiplication phenomenon, that is, the sensitivity to light can be changed using the same material. That is, in the photocurrent multiplication device comprising the resin-dispersed organic semiconductor layer of the present invention, the device performance can be easily controlled with the mixture ratio of the materials.

The measurement results of FIG. 6 were obtained using the resin-dispersed organic semiconductor layer 3 formed by spin coating. Hereinafter, another case of using the resin-dispersed organic semiconductor layer 3 formed by bar coating shall be described. In this case, a dispersion liquid with a perylene pigment dispersed in polycarbonate was prepared by the method described in First Embodiment. The dispersion liquid was applied to the glass substrate 1 with the ITO transparent electrode 2 formed thereon by bar coating in this case, and dried to obtain the resin-dispersed organic semiconductor layer 3. The thickness of the resin-dispersed organic semiconductor layer 3 was the same as that in the case of spin coating. The device structure and the measurement system for observing the photocurrent multiplication phenomenon are the same as those shown in FIG. 5.

Figure 7:
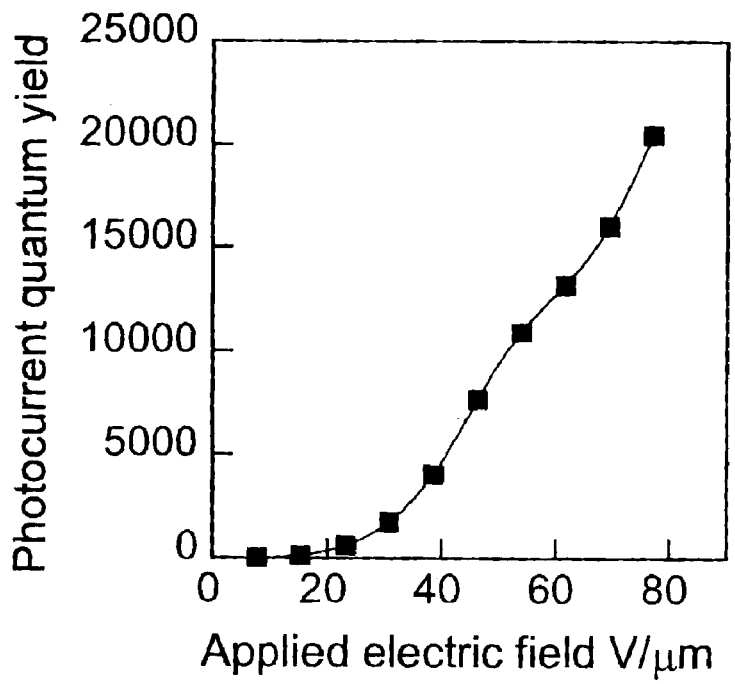
FIG. 7 is a graph showing measurement results of the photocurrent quantum coefficient of a photocurrent multiplication device comprising a resin-dispersed organic semiconductor layer formed by bar coating in the embodiment

FIG. 7 shows results of observation of the photocurrent multiplication phenomenon of a photocurrent multiplication device comprising the resin-dispersed organic semiconductor layer 3 formed by bar coating as described above (perylene dispersion concentration: 50 wt %). The quantum yield at an applied voltage of 77 V/$\mu$m was about 20000, which was roughly the same as that in the case of spin coating shown in FIG. 6.

Figure 8:
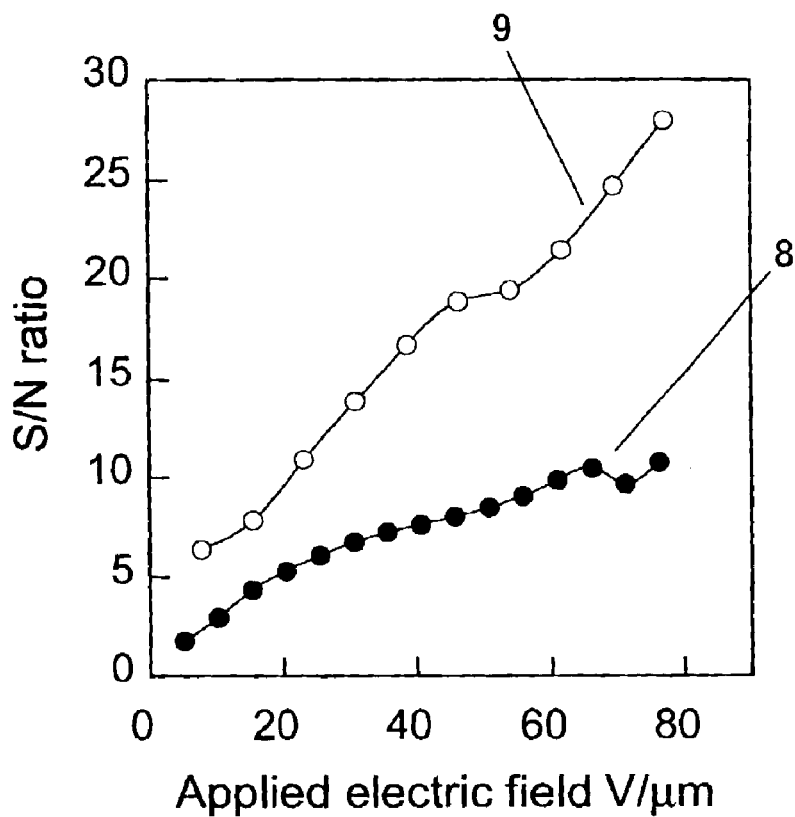
FIG. 8 is a graph showing comparison of the S/N ratios of multiplied photocurrents in the photocurrent multiplication devices comprising the resin-dispersed organic semiconductor layer formed by spin coating and the resin-dispersed organic semiconductor layer formed by bar coating.

FIG. 8 shows the S/N ratio of the photocurrent for the resin-dispersed organic semiconductor layer 3 formed by spin coating denoted by 8 and that formed by bar coating denoted by 9. The S/N ratio as used herein refers to the ratio of a photocurrent S obtained during light irradiation to a current (dark current) N flowing through the device during no light irradiation.

As shown in FIG. 8, while the S/N ratio is about 10 when the resin-dispersed organic semiconductor layer is formed by spin coating (8), it is about 28 when the layer is formed by bar coating (9), indicating that the latter is nearly three times as high as the former. Both the S/N ratio values exhibited by the resin-dispersed organic semiconductor layers formed by spin coating (8) and bar coating (9) are higher than that exhibited by a photocurrent multiplication device comprising a vacuum-evaporated organic thin film as the photocurrent multiplication layer, which is 3 to 5. The S/N ratio is an important performance indicator in application of the photocurrent multiplication device to an optical sensor and the like. Therefore, from the standpoint of the performance, also, the photocurrent multiplication device of the present invention comprising the resin-dispersed organic semiconductor layer is superior to the conventional photocurrent multiplication device comprising a vacuum-evaporated film.

Table 1 summarizes the results of measurement of the multiplication rate for combinations of various kinds of photoconductive organic semiconductors and resins used as the resin-dispersed organic semiconductor layer 3 of the photocurrent multiplication device shown in FIG. 5. For all cases, the resin-dispersed organic semiconductor layer 3 was formed by spin coating, the thickness thereof was about 0.7 $\mu$m, and the dispersion concentration of the photoconductive organic semiconductor was 50 wt. %. The multiplication rate shown in Table 1 was obtained from the measurement results at an applied voltage of 55 V/$\mu$m.

TABLE 1

| Photoconductive organic semiconductor | Resin | Multiplication rate | Irradiation wavelength |
| --- | --- | --- | --- |
| Perylene | Polycarbonate | 12600 | 600 nm |
| Perylene | polyvinyl carbazole | 490 | 600 nm |
| Perylene | polyvinyl butyral | 1700 | 600 nm |
| Im-perylene | Polycarbonate | 10300 | 580 nm |
| Copper phthalocyanine | Polycarbonate | 1180 | 470 nm |
| Copper phthalocyanine | polyvinyl carbazole | 160 | 470 nm |
| Naphthalene | polyvinyl butyral | 70000 | 400 nm |

*The organic semiconductor dispersion concentration is 50% for all cases.

The top item in Table 1 corresponds to the example shown in FIG. 6. It is found that the resin-dispersed organic semiconductor layer made of any of the other combinations exhibits a large multiplication rate.

(Second Embodiment)

Figure 2:
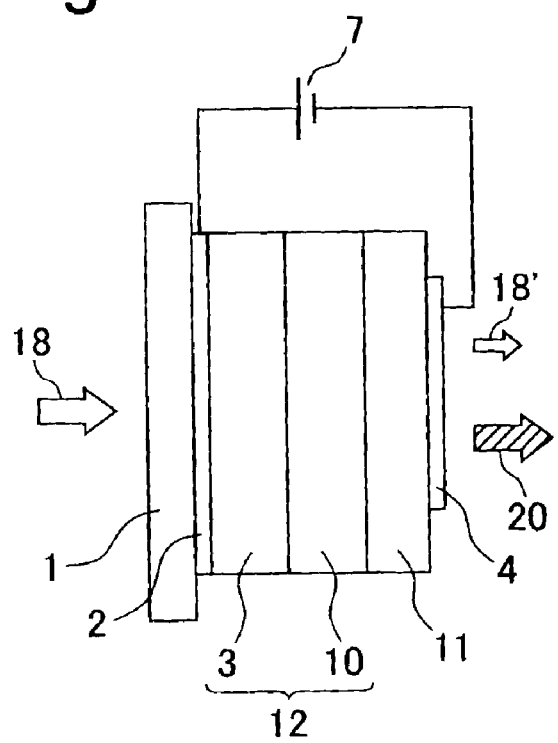
FIG. 2 is a schematic cross-sectional view of a light-light conversion device of the present invention.

In Second Embodiment, the present invention is applied to a light-light conversion device, of which construction is shown in FIG. 2.

Figure 4:
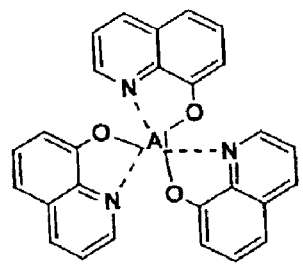
FIG. 4 shows chemical formulae of examples of compounds usable as an organic electroluminescent layer and a hole transport layer in the present invention.
Figure 4:
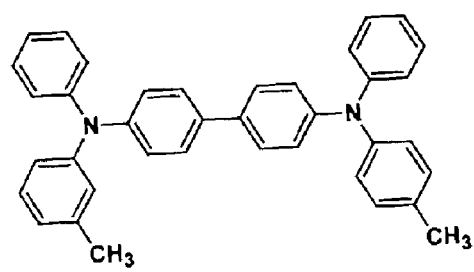

The lower electrode 2 is an ITO transparent electrode formed on the glass substrate 1. The resin-dispersed organic semiconductor layer 3 as the photocurrent multiplication layer is made of Im-perylene pigment dispersed in polycarbonate at a dispersion concentration of 50%. The thickness of the layer is 0.5 $\mu$m. As the organic electroluminescent layer 10 formed integrally on the resin-dispersed organic semiconductor layer 3, used was an evaporated film of an aluminum-quinolinol complex (Alq$_3$) shown as chemical formula C12 in FIG. 4. As the hole transport layer 11 provided between the resin-dispersed organic semiconductor layer 3 and the upper electrode 4, used was an evaporated film of a triphenyl-diamine derivative (TPD) shown as chemical formula C13 in FIG. 4. As the upper electrode 4, a gold evaporated film was used.

Figure 9:
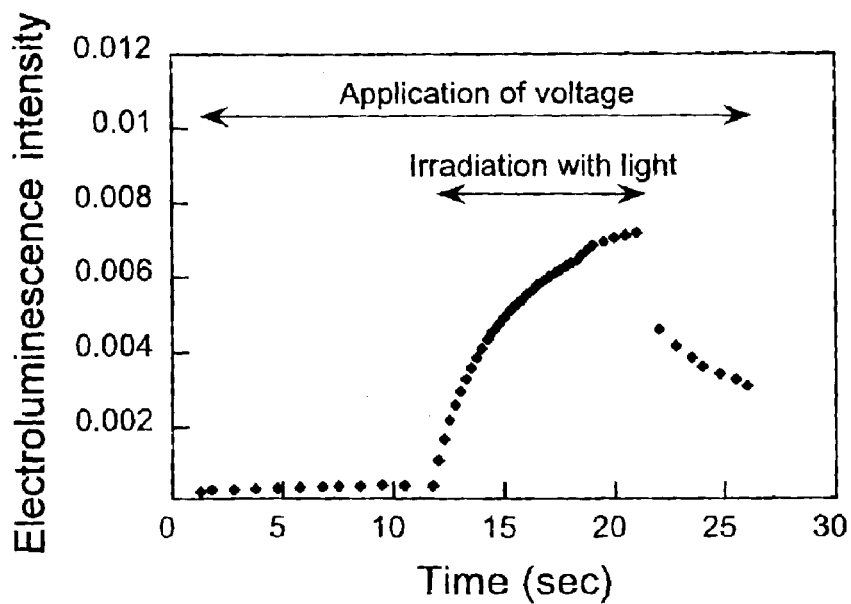
FIG. 9 is a graph showing measurement results of the output light intensity in an embodiment of a light-light conversion device. 0
Figure 10:
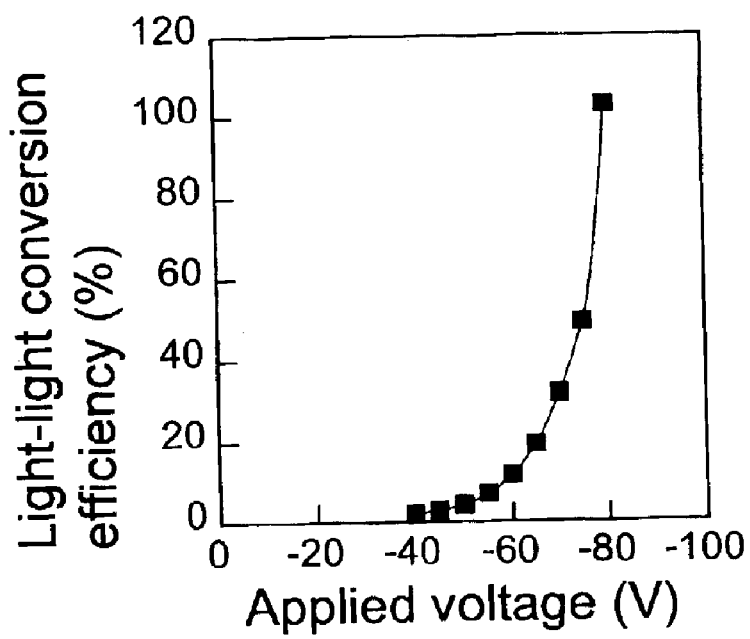

FIG. 9 shows the intensity of the electroluminescent output light 20 responding to the input light 18 incident on the light-light conversion device during application of a voltage to the device by means of the electrodes 2 and 4.

As is found from the results shown in FIG. 9, electroluminescence was not observed by application of a voltage alone, but light emission by electroluminescence was confirmed only when the device was irradiated with light. This is because the organic electroluminescent layer 10 emitted light in response to the flow of a photocurrent generated in the resin-dispersed organic semiconductor layer 3 as the photocurrent multiplication layer through the device.

0 FIG. 1 shows the applied voltage dependency of the light-light conversion efficiency. The conversion efficiency as used herein refers to the ratio of the number of outgoing photons by electroluminescence to the number of input photons absorbed by the resin-dispersed organic semiconductor layer 3.

It is found that the light-light conversion efficiency increases with increase of the applied voltage, exceeding 100% at maximum. In other words, the light-light conversion device of this embodiment can amplify the incident light by the photocurrent multiplication effect.

In addition, in this embodiment, light having a wavelength of 780 nm was used as the input light 18, and as a result, emission of green light of Alq$_3$ having a peak wavelength of 540 nm was confirmed as the output light 20. This indicates that the device of this embodiment can perform light wavelength conversion of outputting light having a wavelength shorter than that of input light Industrial Applicability The photocurrent multiplication device of the present invention can be used as a light detecting device and is suitable particularly for detection of faint light. The light-light conversion device is suitable for use in fields requiring light wavelength conversion.

What is claimed is:

1. A multiplication device comprising:

a resin-dispersed organic semiconductor layer comprising a photoconductive organic semiconductor dispersed in a resin; and electrodes formed on front and back surfaces of the resin-dispersed organic semiconductor layer, wherein the structure of the resin-dispersed organic semiconductor layer and a voltage applied by the electrodes are set so as to have a light amplification function that the resin-dispersed organic semiconductor layer is irradiated with light while the voltage is applied to the resin-dispersed organic semiconductor layer by means of the electrodes, the voltage being large enough to permit a photocurrent to flow between the electrodes at a quantum yield of 1 or more when the resin-dispersed organic semiconductor layer is irradiated with light, to obtain a light irradiation-induced current at a multiplied quantum yield.

2. A multiplication device comprising:

a layered structure comprising an organic electroluminescent layer formed on a resin-dispersed organic semiconductor layer comprising a photoconductive organic semiconductor dispersed in a resin; and electrodes applying a voltage between front and back surfaces of the layered structure, wherein the resin-dispersed organic semiconductor layer is irradiated with light while a voltage is applied to the layered structure by means of the electrodes, the voltage being large enough to permit a photocurrent to flow between the electrodes at a quantum yield of 1 or more when the resin-dispersed organic semiconductor layer is irradiated with light, to obtain light-light converted light from the organic electroluminescent layer; wherein the structure of the layers and the applied voltage are set so as to have a light amplification function that the intensity of output light from the organic electroluminescent layer exceeds the intensity of input into the resin-dispersed organic semiconductor layer.

3. The multiplication device according to claim 2, wherein a hole transport layer is formed between the organic electroluminescent layer and the electrode.

4. The multiplication device according to claim 2, wherein a material having a luminous wavelength falling outside a sensitivity range of the resin-dispersed organic semiconductor layer is used as a luminous material of the orgainc electroluminescent layer, so that the wavelength of the output light from the organic electroluminescent layer is different from the wavelength of input light into the resin-dispersed organic semiconductor layer.

5. The multiplication device according to claim 1, wherein the photoconductive organic semiconductor is one selected from perylene pigments, phthalocyanine pigments, quinacridon pigments and their derivatives, or a mixture of any of them.

6. The multiplication device according to claim 1 or 2, wherein the resin is a general polymer or a conductive polymer.

* * * * *